United States Patent [19]
Fedde et al.

[11] Patent Number: 4,510,683
[45] Date of Patent: Apr. 16, 1985

[54] FORCE ASSEMBLER APPARATUS FOR ROBOTS

[75] Inventors: George A. Fedde, Perkiomenville; Kenneth H. Kirk, Harleysville, both of Pa.

[73] Assignee: Sperry Corporation, New York, N.Y.

[21] Appl. No.: 546,148

[22] Filed: Oct. 27, 1983

[51] Int. Cl.³ .................... B23P 21/00; B23Q 15/00
[52] U.S. Cl. ........................ 29/701; 29/709; 29/729; 29/739; 29/743; 29/759; 29/DIG. 44; 414/744 B; 901/9; 901/45
[58] Field of Search ............... 29/701, 709, 729, 739, 29/740, 741, 743, 759, DIG. 44; 414/730, 744 R, 744 A, 744 B; 901/9, 45

[56] References Cited

U.S. PATENT DOCUMENTS

| | | | |
|---|---|---|---|
| 3,943,343 | 3/1976 | Irie | 414/730 X |
| 3,967,356 | 7/1976 | Holt | 29/701 |
| 4,041,294 | 8/1977 | Inoyama et al. | 29/709 X |
| 4,080,730 | 3/1978 | Woodman, Jr. | 29/701 |
| 4,218,172 | 8/1980 | Freund | 901/9 X |
| 4,283,153 | 8/1981 | Brendamour | 901/45 X |
| 4,393,579 | 7/1983 | Van Hooreweder | 29/743 X |
| 4,400,885 | 8/1983 | Consales | 901/45 X |
| 4,464,833 | 8/1984 | Duncan | 29/709 |
| 4,472,668 | 9/1984 | Mutschler et al. | 414/730 |

FOREIGN PATENT DOCUMENTS

| | | | |
|---|---|---|---|
| 819794 | 4/1981 | U.S.S.R. | 414/730 |
| 826275 | 5/1981 | U.S.S.R. | 414/730 |

*Primary Examiner*—Howard N. Goldberg
*Assistant Examiner*—Ronald S. Wallace
*Attorney, Agent, or Firm*—James R. Bell; Thomas J. Scott; Marshall M. Truex

[57] ABSTRACT

A programmable force assembler for robots includes a bi-directionally actuatable slide member. A microprocessor is programmable for controlling insertion force independent of the distance moved by the slide member. A position indicator transmits slide member distance signals and velocity information to the microprocessor. A pressure transducer is connected to the bi-directional actuator and is coupled to send signals to the microprocessor. A supply valve is connected to the bi-directional actuator and is coupled for receiving signals from the microprocessor in response to the pressure transducer signals.

6 Claims, 2 Drawing Figures

FORCE ASSEMBLER APPARATUS FOR ROBOTS

BACKGROUND OF THE INVENTION

1. Field of the Invention

This invention relates generally to work holders for electrical circuit assemblages and more particularly to automated insertion of the pins of various multiple lead electronic devices into corresponding pin holes in a printed circuit board.

2. Description of the Prior Art

Robots are used for the assembly of electronic equipment such as for mounting multiple lead IC chips and other devices on circuit boards. Examples of such devices include ceramic chip carriers, relays, transformers, IC devices, resistor network devices and other devices having pins or fragile leads which may, for example, be on 0.050 inch centers. The robots require sensor feedback to accomplish such assembly without damage to the devices.

Present known robots use servo-systems and are programmed to move a robotic arm specific distances in the X-Y axes, i.e. in a plane parallel to the board, and, once reaching the proper X-Y coordinates, to then move in the Z axis, i.e. vertically toward and away from the board, to accomplish alignment followed by insertion of the leads into holes in the board. The board is semi-flexible and the periphery of the board is supported. As a result, the board has some compliance in the Z axis. Also, the flexibility of the leads provides additional compliance in the Z direction. Further, Bernoulli type and vacuum type holders, or remote center compliant devices attached to the robotic arm, provide compliance in the X-Y plane while holding the device for insertion. The total X-Y-Z compliance provides beneficial deflection in the assembly system which aids in limiting damage to the devices during insertion attempts.

Insertion forces are set by the compliance of the holders and workpieces. Considering that the 10–100 pound robotic arm is handling workpieces weighing 1–10 grams, the above-mentioned built-in compliance is at times insufficient to limit substantial force overshoot by the robotic arm. As a result, the overshoot may cause excessive insertion forces sufficient to damage the leads in those cases in which the leads do not insert in the holes. Force sensors are used to detect successful assembly. The robotic arm is set to move a certain distance at a certain velocity while monitoring insertion force. The force sensors monitor excessive force and stop arm movement when the force exceeds a programmed limit. The various signal channels used to stop robot motion have limited bandwidth resulting in time delay that causes overshoot and excessive force to be applied.

The foregoing illustrates limitations of the known prior art. Thus, it is apparent that it would be advantageous to provide an alternative directed to overcoming one or more of the limitations as set forth above. Accordingly, a suitable alternative is provided including features more fully disclosed hereinafter.

SUMMARY OF THE INVENTION

In one aspect of the present invention, this is accomplished by providing a force assembler apparatus for robots including a slide member which is bi-directionally actuated. A microprocessor is programmable for controlling insertion force independent of the distance moved by the slide member. A position indicator is connected to the slide member and is coupled to relay slide member distance signals and velocity information to the microprocessor. A pressure transducer is connected to the bi-directional actuator and is coupled to send signals to the microprocessor. A supply valve is connected to the bi-directional actuator and is coupled for receiving signals from the microprocessor in response to the pressure transducer signals.

The foregoing and other aspects will become apparent from the following detailed description of the invention when considered in conjunction with the accompanying drawing. It is to be expressly understood, however, that the drawing is not intended as a definition of the invention but is for the purpose of illustration only.

DESCRIPTION OF THE PREFERRED EMBODIMENT

Figure 1:
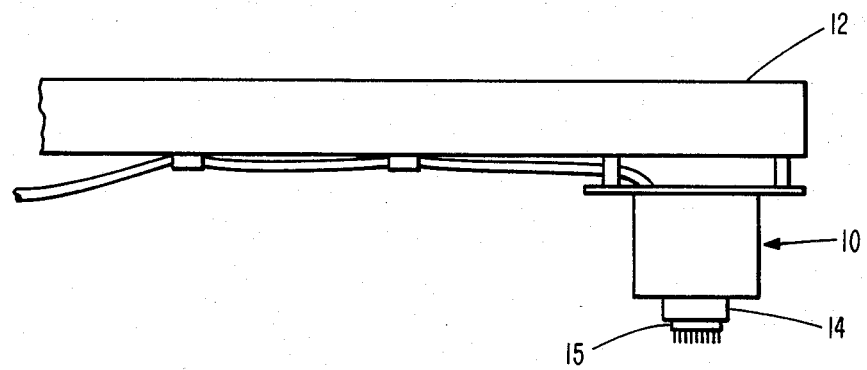
FIG. 1 is a view graphically illustrating an embodiment of a force assembler apparatus attached to a robotic arm.
Figure 2:
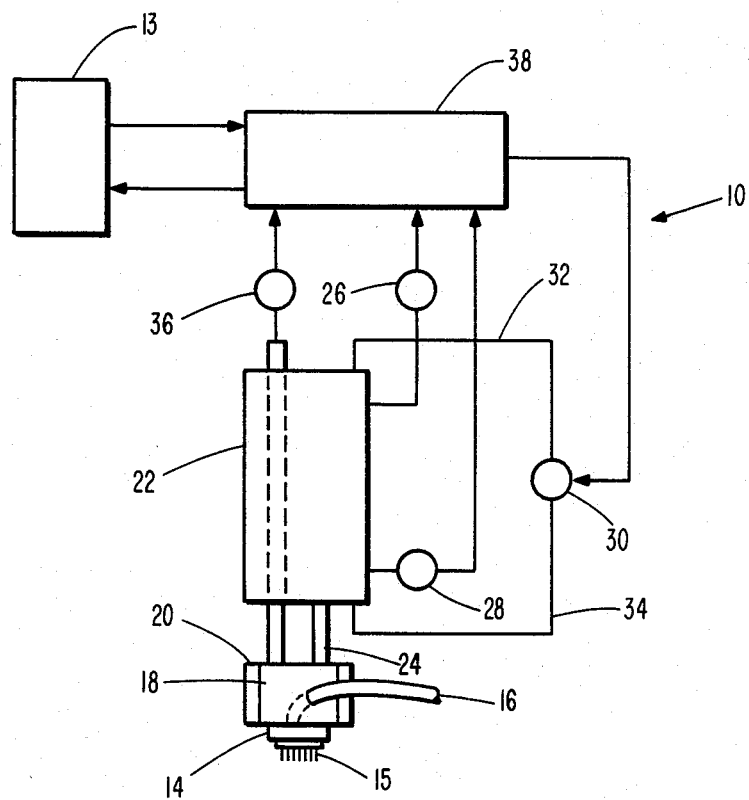
FIG. 2 is a view graphically illustrating an embodiment of the force assembler apparatus of this invention.

A force assembler apparatus is generally designated 10 in FIG. 1 and can be connected for use with a known robotic arm 12 such as the Model No. A12 Allegro manufactured by General Electric Co.

The assembler 10 may include a Bernoulli-type or vacuum type holder 14 commonly used for holding a multiple lead IC chip 15 during the assembly of electronic devices. Holder 14 is connected to either a positive or negative air source via an air line 16 depending on whether the Bernoulli or vacuum-type holder is used.

Holder 14 is directly connected to a movable slide member 18 of a commercially available ball slide 20 such as Model J-1 manufactured by Automation Gages, Inc. of Rochester, N.Y. Slide member 18 is bi-directionally movable relative to ball slide 20. This provides vertical movement of holder 14 which is precise and repeatable.

A bi-directional pneumatic actuator 22 such as Model SD, available from Compact Air Products of Westminster, S.C., is connected by a piston 24 to move slide member 18 in vertical up and down motions as viewed in the drawing figures. Suitable differential pressure transducers 26, 28 are connected to actuator 22 for using a pressure differential approach for up and down drive which allows for offsetting up forces to balance gravity forces acting on piston 24, holder 14 and chip 15. An electrically controlled pressure supply value 30, similar to Model T 5000-03 (3–15 psig) available from Fairchild Industrial Products, is connected via a "down" supply line 32 and an "up" supply line 34 to actuator 22. A position indicator 36 such as Dyer Electric Caliper Model ELI-71, is connected to slide member 18 to monitor movement thereof. Alternatively, a velocity measuring transducer could also be used in addition to position indicator 36.

A microprocessor 38 such as Model MC68HC11 is manufactured by Motorola. Microprocessor 38 is electrically connected to send signals to and receive signals from a well known controller 13 for arm 12; to send signals to valve 30; and to receive signals from transducers 26, 28 and indicator 36.

Typically, arm 12 is moved to a device pick-up station by controller 13 which instructs microprocessor 38 to move slide member 18 to pick up device 15. This instruction includes data on the force to be applied and the distance to be moved to pick up device 15. Device holder 14 is moved (for example vertically downward as viewed in the drawing Figures) and the force data is applied and (for example) vacuum is concurrently applied to holder 14. The vacuum is monitored as well as the position of holder 14 to determine if a successful pick up has been accomplished. Microprocessor 38 then instructs slide member 18 to retract holder 14 and signals controller 13 that device 15 has been picked up.

Controller 13 then moves arm 12 to a substantially accurate position where device 15 is to be inserted into a circuit board (not shown). Controller 13 then signals microprocessor 38 to insert device 15. Microprocessor 38 receives insertion force and distance data from controller 13. This data will, in general, differ from the data used for the pick up of device 15, described above. Microprocessor 38 instructs slide member 18 to move holder 14 vertically downwardly at a programmed force and distance for a device 15 having a known weight. As this instruction is carried out, microprocessor 38 monitors the distance at which the downward motion is stopped. If this distance is within the acceptable range for insertion, the vacuum is released and slide member 18 retracts holder 14. Microprocessor 38 then signals controller 13 that insertion is complete.

In the event that device 15 does not insert, the distance moved by holder 14 will be too small and microprocessor 38 will retract holder 14 and signal controller 13 of an unsuccessful insertion attempt at that location. Controller 13 will then follow its program and try to insert the same device 15 at another nearby location or will reject device 15 and get another device 15.

The foregoing has described force assembler apparatus 10 for robots utilizing microprocessor 38 programmable to a predetermined insertion force independent the distance moved by slide member 18. Slide 18 is bi-directionally actuated by actuator 22. Position indicator 36 is connected to relay slide member distance signals from actuator 22 to microprocessor 38. Pressure transducers 26, 28 are connected to bi-directional actuator 22 and are coupled to send signals to microprocessor 38. Supply valve 30 is also connected to the bi-directional actuator 22 and is coupled for receiving signals from microprocessor 38 in response to the pressure transducer signals. Microprocessor 38 measures the rate of change of the distance signals sent by indicator 36 to determine the velocity of slide member 18. This velocity is controlled by signals from microprocessor 38 to valve 30 so that when device 15 contacts an associated circuit board (not shown), the combined inertia of piston 24, slide member 18, holder 14 and device 15, will not result in a force higher than desired. Therefore, whereas in the past such assemblers were set to move a certain distance while monitoring force, the apparatus of this invention is set to a programmed insertion force while monitoring distance.

It is anticipated that aspects of the present invention, other than those specifically defined in the appended claims, can be obtained from the foregoing description and the drawings.

Having thus described the invention, what is claimed is:

1. Force assembler apparatus for robots comprising:
    a movable slide member;
    a bi-directional actuator connected to the slide member;
    microprocessor means programmable for controlling insertion force independent of distance moved by the slide member;
    position indicator means connected to the slide member and coupled to send slide member distance signals and velocity information to the microprocessor;
    pressure transducer means connected to the bi-directional actuator and coupled for sending signals to the microprocessor; and
    supply valve means connected to the bi-directional actuator and coupled for receiving signals from the microprocessor in response to the position indicator signals and pressure transducer signals.

2. The apparatus of claim 1 including:
    a robotic arm connected to the slide member and having a controller coupled to send signals to and receive signals from the microprocessor.

3. The apparatus of claim 2 including:
    a device holder connected to the slide member.

4. Force assembler apparatus for robots comprising:
    a movable slide member;
    means connected for bi-directionally actuating the slide member;
    microprocessor means programmable for controlling insertion force and for monitoring distance moved by the slide member and for determining the velocity thereof;
    a position indicator connected to the slide member;
    means coupled for carrying distance signals and velocity information from the position indicator to the microprocessor;
    a pressure transducer connected to the bi-directional actuator;
    means coupled for carrying signals from the pressure transducer to the microprocessor;
    a supply valve connected to the bi-directional actuator; and
    means coupled for carrying signals from the microprocessor to the supply valve, said signals including programmed microprocessor data responsive to position indicator signals and pressure transducer signals.

5. The apparatus of claim 4 including:
    a device holder connected to the slide member.

6. A robotic assembler having an arm and a controller for mounting electronic devices on a circuit board comprising:
    a movable slide member connected to the arm;
    means connected for bi-directionally actuating the slide member;
    microprocessor means coupled to send signals to and receive signals from the robotic controller, said microprocessor being programmable for controlling insertion force for devices of varying weight, and for monitoring and controlling distance moved by the slide member and determining the velocity thereof;
    position indicator means connected to the slide member and coupled to send slide member distance signals and velocity information to the microprocessor;
    pressure transducer means connected to the slide member actuating means and coupled for sending signals to the microprocessor;
    a supply valve connected to the slide member actuating means; and
    means coupled for carrying signals from the microprocessor to the supply valve, said signals including programmed microprocessor data responsive to robotic arm signals, position indicator signals and pressure transducer signals.

* * * * *